United States Patent [19]

Lin

[11] Patent Number: 6,132,565
[45] Date of Patent: Oct. 17, 2000

[54] MAGNETRON ASSEMBLY EQUIPPED WITH TRAVERSING MAGNETS AND METHOD OF USING

[75] Inventor: Chih-Lung Lin, Taipei, Taiwan

[73] Assignee: Taiwan Semiconductor Manufacturing Company, Ltd, Hsin-Chu, Taiwan

[21] Appl. No.: 09/411,694

[22] Filed: Oct. 1, 1999

[51] Int. Cl.[7] .................................................. C23C 14/35
[52] U.S. Cl. ............................. 204/192.15; 204/192.12; 204/192.16; 204/192.17; 204/192.22; 204/298.19; 204/298.2; 204/298.12; 204/298.21; 204/298.22; 204/298.27; 330/47; 331/154; 331/157; 315/29.51; 315/32
[58] Field of Search ..................... 204/192.12, 192.15, 204/192.16, 192.17, 192.22, 298.19, 298.2, 298.12, 298.21, 298.22, 298.27; 330/47; 331/157, 154; 315/39.51, 32; 118/723 MW, 723 MA

[56] References Cited

U.S. PATENT DOCUMENTS 5,188,717  2/1993  Broadbent et al. ................ 204/192.12
5,314,597  5/1994  Harra ................................. 204/192.13
5,795,451  8/1998  Tan et al. ............................ 204/298.2
5,830,327  11/1998  Kolenkow .......................... 204/192.12

FOREIGN PATENT DOCUMENTS 2707144   8/1977   Germany .
63-149374  6/1988   Japan .
2-11761   1/1990   Japan .

*Primary Examiner*—Alan Diamond
*Attorney, Agent, or Firm*—Tung & Associates

[57] ABSTRACT

A magnetron assembly for sputter deposition and a method for using such assembly are described. The novel magnetron assembly is equipped with traversing magnets that are capable of moving in a radial direction toward and away from a center axis of the magnetron simultaneously with the rotational motion of the assembly. The traversing magnets enables a substantially uniform magnetic flux distribution to be formed which leads to not only a more uniform film deposition on a wafer surface, but also a more uniformly consumed metal target surface leading to a longer target life. The non-uniformity of a film deposited in a metal sputtering process frequently seen when using a conventional magnetron assembly is substantially eliminated.

20 Claims, 3 Drawing Sheets

MAGNETRON ASSEMBLY EQUIPPED WITH TRAVERSING MAGNETS AND METHOD OF USING

FIELD OF THE INVENTION

The present invention generally relates to a magnetron assembly for use in a sputter deposition chamber and a method of using and more particularly, relates to a magnetron assembly that is equipped with traversing magnets that moves in a radial direction simultaneously with a rotational motion of the assembly such that a substantially uniform magnetic field can be generated and a method for using such magnetron assembly.

BACKGROUND OF THE INVENTION

Physical vapor deposition (PVD) process has been widely used in semiconductor processing for the deposition of metal layers. A basic sputtering process frequently employs a plasma of argon gas which can be advantageously generated by a flow discharge. The argon plasma sustained by the secondary electrons generated from ion bombardment of a cathode. The charged ions in the argon plasma then defuse into a special zone between the cathode and the anode to acquire a higher energy level and to strike the cathode, or the target surface. The momentum of the argon ion transverse to the target material and ejects one or more atoms from the surface of the target. The ejected atom of a neutral charge flies through the plasma and lands on a wafer surface.

In the sputtering deposition process, one most important concern is to increase the ion bombardment rate on the cathode such that a reasonable deposition rate can be achieved. Since the glow discharge relies on the secondary electrons from the target and therefore is intrinsically inefficient, it is desirable to design means to increase the secondary electron production and the efficiency of ionization in order to improve the sputtering rate. One of such designs is the use of an E×B field to enhance the trapping of electrons. The cathode design using such a magnetic field is known as magnetron. The improved magnetron sputtering process increases the sputtering deposition rate and makes sputtering a leading technique in physical vapor deposition.

In a magnetron sputtering system, axial magnetic field is utilized with a planar diode for increasing the path length of the electrons and furthermore, to keep them away from the chamber walls. The object is to trap electrons near the target to increase their ionizing effect and thus increasing the deposition rate. The electric field and the magnetic field generated are usually perpendicular to each other. The magnetic field, when utilized in a magnetron sputtering technique, captures and spiral electrons to increase their ionizing efficiency in the vicinity of the sputtering target. In the magnetron sputtering of aluminum metal, deposition rates as high as 1 μm/min have been achieved.

FIG. 1 shows a simplified cross-sectional view of a typical magnetron sputtering system 10. The metal target material to be sputtered is normally made into a disc 12 that is thermally bonded to the cathode 14. A large amount of power is supplied to the argon plasma 16 to maximize the sputtering rate of metal particles 20 from the target 12. Since most of the power is absorbed by the sputtering target 12, the target must be cooled through thermal contact 22 with the cathode 14 which in turn is water-cooled through a cooling water supply inlet 26. A wafer 28 is positioned on a heater 30, which is also a wafer platform in the sputtering chamber 18. After the chamber 18 is first pumped through a pump outlet 24, argon gas is fed into chamber 18 through a plasma gas inlet 32. Ceramic insulators 34 are further provided to electrically insulate the cathode 14 from the chamber wall 36.

In addition to the high deposition rate requirement for a sputtering apparatus, another critical criterion for a sputtering deposition process is its ability to produce a deposited film with high uniformity. This is especially critical when large wafers, i.e., wafers larger than 200 mm diameter, are being deposited in a metal sputtering chamber. To achieve both the high deposition rate and the film uniformity, more recently developed sputtering machines are equipped with cathodes that have rotating permanent magnets 40 that are made of rare earth, high strength materials.

A cathode 14 which rotates behind a metal target 12 in the rotational direction as marked is shown in a plane view in FIG. 2. Since the magnets 40 are in a fixed position in the radial direction of the cathode 14, an inherent drawback of the cathode is its inability to produce a magnetic flux field that has uniform flux distribution. As a result, certain areas on the target surface 38 is bombarded more than other areas. This is caused by the non-uniform plasma ion distribution in the plasma cloud 16 which is in turn caused by the non-uniform magnetic flux distribution formed during the rotation of the cathode 14.

In the conventional magnetron sputter, the magnets are permanently mounted in a cathode and rotates above a metal target (as shown in FIG. 1) to create a magnetic flux field. In order to produce the required magnetic strength and flux distribution, different magnet assemblies are required for use in different processes. This requires a tedious and labor intensive task of replacing cathodes in a magnetron sputter apparatus frequently.

A typical example of a target erosion wherein certain areas in the surface of a metal target suffer more severe plasma ion bombardment resulting in more severe erosion for a titanium target is shown in an erosion profile in FIG. 3A. When such a severe, non-uniform erosion profile is formed on a metal target, the target must be replaced more frequently than normally necessary in order to avoid the wearing-through of certain areas on the target by the non-uniform bombardment. As seen in FIG. 3A, the titanium target is almost worn through ⅔ of the way at an outer fringe area 44 (shows up in a donut form when viewed from the top of the target) when compared to the center area 42 of the titanium target. A similar graph illustrating the non-uniform wear of a TiN target is shown in FIG. 1B.

The non-uniform wear, or consumption of the metal target surface shown in FIGS. 3A and 3B not only causes a premature failing and a need for replacement of the metal target, but also severely affects the uniformity of the deposited film. This is shown in FIG. 4, a plot of non-uniformity or deviation of the film thickness against time for the sputter deposition of TiN films. At points A and B, new targets were installed to replace a prematurely worn target. As seen in FIG. 4, of the non-uniformity of the deposited film gradually increases at approximately the same rate each time after the new target is installed. The data of FIG. 4 can be coordinated with the data of FIG. 3B since the more severely eroded TiN target (i.e., having more severely formed peaks and valleys), the more non-uniform the magnetic flux distribution resulting in greater non-uniformity in the deposited TiN film. It is seen in FIG. 4, at the beginning of a new target, the non-uniformity of the deposited TiN film is very small. The non-uniformity gradually increases as the surface of the metal target is more severely eroded forming donut sections which are bombarded more severely by the plasma ions due to the non-uniform magnetic flux distribution. The non-uniform magnetic flux distribution, as previously discussed, is cased by a cathode that has magnets mounted on top in fixed positions.

It is therefore an object of the present invention to provide a magnetron assembly for sputter deposition that does not have the drawbacks or shortcomings of the conventional magnetron assemblies.

It is another object of the present invention to provide a magnetron assembly that is equipped with traversing magnets capable of making linear motion in a radial direction simultaneously with the rotational motion of the assembly.

It is a further object of the present invention to provide a magnetron assembly for sputter deposition that is equipped with traversing means for mounting the magnets which is driven by motors capable of producing a substantially uniform magnetic flux distribution.

It is another further object of the present invention to provide a magnetron assembly that is equipped with traversing magnets capable of making linear motions at a speed in a range between about 2 mm/sec and about 20 mm/sec.

It is still another object of the present invention to provide a method for sputter depositing a metal on an electronic substrate that is capable of depositing a more uniform film on the substrate.

It is yet another object of the present invention to provide a method for sputter depositing a metal on an electronic substrate by mounting magnets on a traversing means and moving the magnets in a radial direction while simultaneously rotating the magnetron assembly.

It is still another further object of the present invention to provide a sputter deposition chamber that is equipped with a magnetron assembly which has magnets mounted on traversing means for making radial movements when the assembly rotates around a center axis.

It is yet another further object of the present invention to provide a sputter deposition chamber equipped with a magnetron assembly formed of a disc for rotating about a center axis and magnets mounted on traversing means for moving toward and away from the center axis simultaneously with a rotational motion of the assembly.

SUMMARY OF THE INVENTION

In accordance with the present invention, a magnetron assembly that is equipped with traversing magnets and a method for using the assembly are disclosed.

In a preferred embodiment, a magnetron assembly for sputter deposition is provided which includes a disc for rotating about a center axis and for mounting a plurality of magnets thereon, and a plurality of magnets mounted spaced-apart circumferentially on the disc wherein each of the plurality of magnets is mounted on a traversing means for moving in a radial direction toward and away from the center axis simultaneously with a rotational motion of the disc such that a substantially uniform magnetic field can be generated.

In the magnetron assembly for sputter deposition, the traversing means may further include a platform on which a magnet is mounted, a threaded aperture in the platform, a worm gear for threadingly engaging the threaded aperture, and a motor means for rotating the worm gear to cause a linear traversing motion of the platform toward and away from the center axis. The magnetron assembly may further include six magnets and three traversing means with two magnets mounted on each traversing means. The traversing means may move at a linear speed between about 2 mm/sec and about 20 mm/sec. The disc for the magnetron assembly may be a ring-shaped disc. The plurality of magnets may be mounted equally spaced-apart circumferentially on the disc. The assembly may further include a metal target which has substantially the same size as the disc and is mounted juxtaposed to the disc.

The present invention is further directed to a method for sputter depositing a metal on an electronic substrate that can be carried out by the operating steps of providing a magnetron assembly which includes a disc for rotating about a center axis and a plurality of magnets mounted thereon, each of the plurality of magnets is mounted on a traversing means for moving radially toward and away from the center axis simultaneously with a rotational motion of the disc, mounting a metal target on the disc of the magnetron assembly, positioning the magnetron assembly in a sputter chamber with the metal target over the electronic substrate, activating the magnetron assembly and igniting a plasma in the chamber, and sputter depositing metal from the metal target onto the electronic substrate.

The method for sputter depositing a metal on an electronic substrate may further include the step of evacuating the sputter chamber prior to activating the magnetron assembly. The method may further include the step of operating the traversing means by first mounting the magnet on a platform and then traversing the platform by motor and worm gear means, or the step of operating the traversing means at a speed between about 2 mm/sec and about 20 mm/sec. The method may further include the step of mounting six magnets equally spaced circumferentially on the disc on three traversing means such that each one of the three traversing means operates two magnets in a synchronized manner. The method may further include the step of transforming a rotational motion of the worm gear into a linear motion of the platform, or the step of threadingly engaging the worm gear with a threaded aperture in the platform. The method may still further include the step of generating a substantially uniform magnetic flux distribution in the magnetron assembly by traversing the magnets simultaneously with the rotational motion of the disc.

In another preferred embodiment, the present invention provides a sputter deposition chamber that includes a magnetron assembly situated on top of the chamber including a disc for rotating about a center axis and for mounting a plurality of magnets thereon wherein each of the plurality of magnets traversing towards and away from the center axis simultaneously with the rotational motion of the disc. A metal target which has a size substantially similar to the disc and is mounted on the disc, a plasma generating means for producing a plasma in the chamber, a wafer holder for supporting a wafer juxtaposed to the metal target, and a vacuum evacuation means for evacuating the deposition chamber.

The sputter deposition chamber may further include traversing means for mounting the plurality of magnets. The traversing means may further include a platform for mounting of the magnets, a threaded aperture in each platform, a worm gear for threadingly engaging the threaded aperture, and a motor for rotating the worm gear to cause the platform to move toward and away from the center axis. The magnetron assembly may further include six magnets and three traversing means with two magnets mounted on each traversing means. The traversing means may move at a linear speed between about 2 mm/sec and about 20 mm/sec.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a magnetron assembly that is equipped with traversing magnets and a method for using such assembly. In the novel magnetron assembly, a disc is first provided for rotating about a center axis and for mounting a plurality of magnets wherein the magnets are preferably mounted spaced-apart, circumferentially on the disc. Each magnet is mounted on a traversing means for moving in a radial direction toward and away from the center axis. The linear motion of the magnets occurs simultaneously with a rotational motion of the disc so that a substantially uniform magnetic flux distribution can be generated.

A variety of mechanical arrangements can be used for moving the magnets. One preferred embodiment provided in the present invention is by using a traversing means which includes a platform for mounting a magnet on top, a threaded aperture inside the platform, a worm gear for threadingly engaging the threaded aperture in the platform, and a motor for rotating the worm gear such that a linear traversing motion can be made by the platform toward and away from the center axis during a sputter deposition.

The present invention magnetron assembly rotates permanent magnets that are mounted on a disc above a metal target. Magnetic flux lines confine the movement of electrons near the metal target surface in helical paths and thus increase electrons which cause ionizing collision. A more efficient plasma with lower energy consumption requirement and higher deposition rate is thus obtained when compared to conventional magnetron assemblies. The present invention novel magnetron assembly greatly reduces metal target erosion profile and thus improves the lifetime of a metal target and more importantly, improves the uniformity of film deposited in the sputtering apparatus. The present invention novel magnetron assembly therefore is effective in eliminating the drawbacks of the conventional magnetron assembly, namely a non-uniform film deposition on a wafer surface after a target has been repeatedly used, and a severe erosion profile on a metal target which shortens the target life.

It has been shown that when the metal target surface becomes uneven, i.e., eroded in a doughnut-shape profile, the ion bombardment and the resulting metal sputtering becomes uneven leading to non-uniform film deposition. The present invention not only improves the uniformity of film deposited on a wafer surface, also improves the target life of a metal target by consuming the target surface in a more uniform manner.

Figure 5:
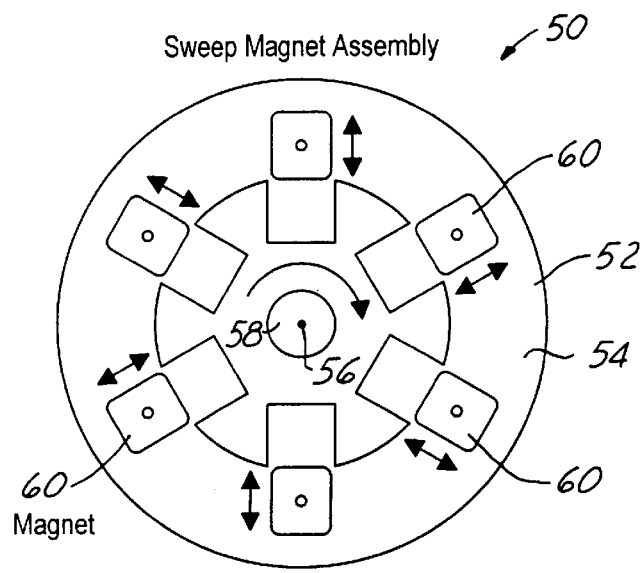
FIG. 5 is a plane view of the present invention magnetron assembly that is equipped with traversing magnets.

Referring now to FIG. 5 wherein a plane view of a present invention magnetron assembly 50 is shown. It should be noted that the magnetron assembly 50 is shown in a simplified manner for clarity reasons. As a result, the traversing means utilized in the present invention is only shown in FIG. 6. The present invention magnetron assembly 50 is constructed of a flat disc 52 which has a top surface 54, and a plurality of magnets 60 which are provided and are capable of making traversing linear motion toward and away from a center axis 56. It should be noted that while an aperture 58 is shown in the flat disc 52, the aperture may not be necessary when the traversing means 70, shown in FIG. 6, is installed on the top surface 54 of the disc 52.

Figure 1:
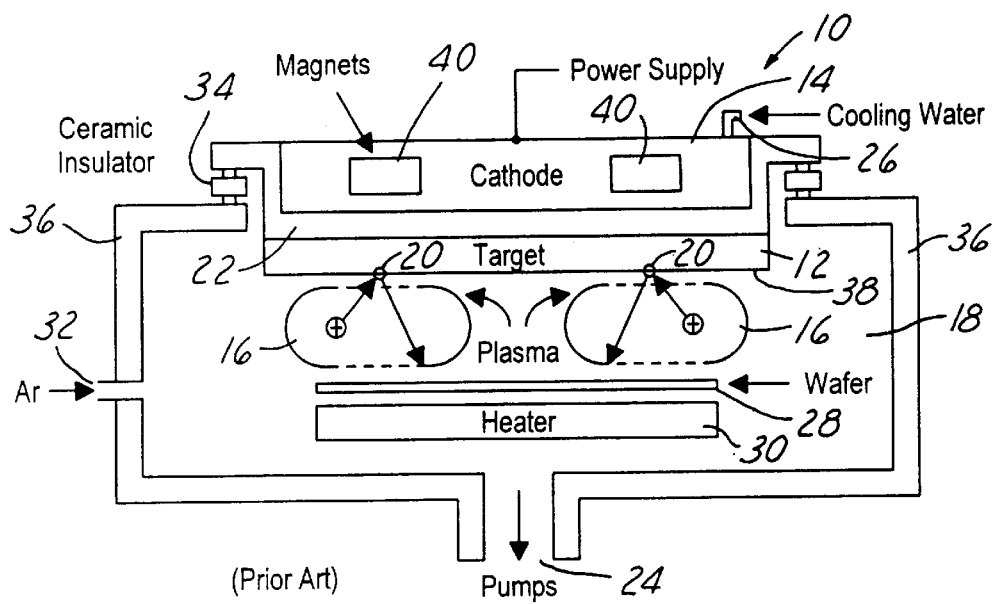
FIG. 1 is a cross-sectional view of a conventional sputter apparatus equipped with a magnetron assembly.
Figure 2:
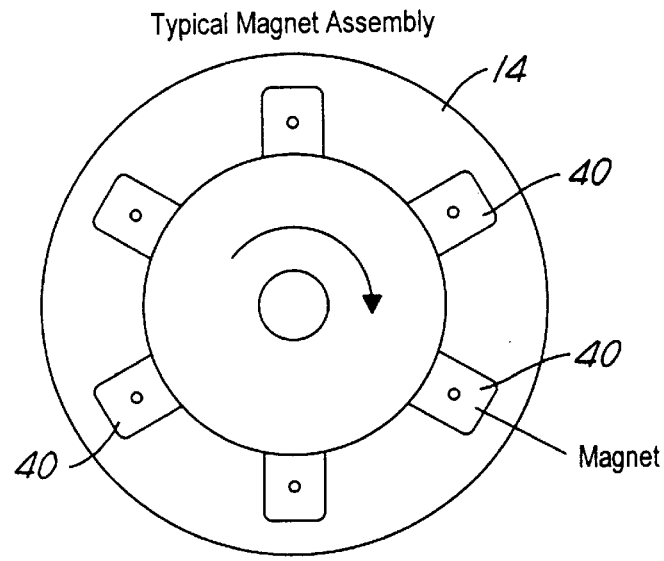
FIG. 2 is a plane view of the magnetron assembly shown in FIG. 1.
Figure 6:
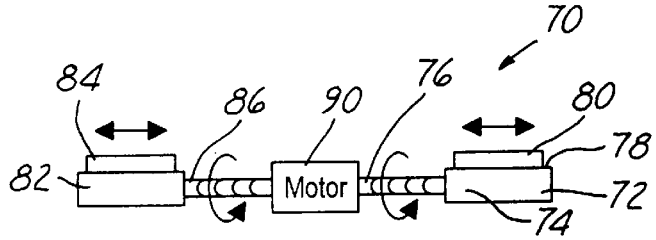
FIG. 6 is a cross-sectional view of a traversing means for moving the magnets in the present invention magnetron assembly.
Figure 3A:
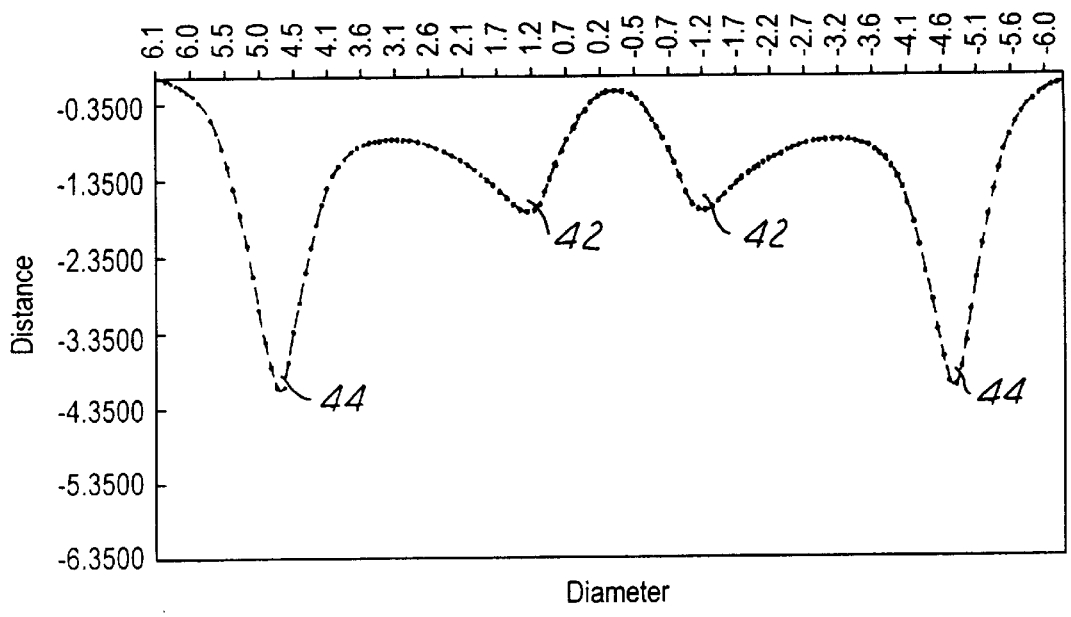
FIG. 3A is a graph illustrating an erosion profile of a titanium target surface after repeated deposition processes utilizing a conventional magnetron assembly.
Figure 3B:
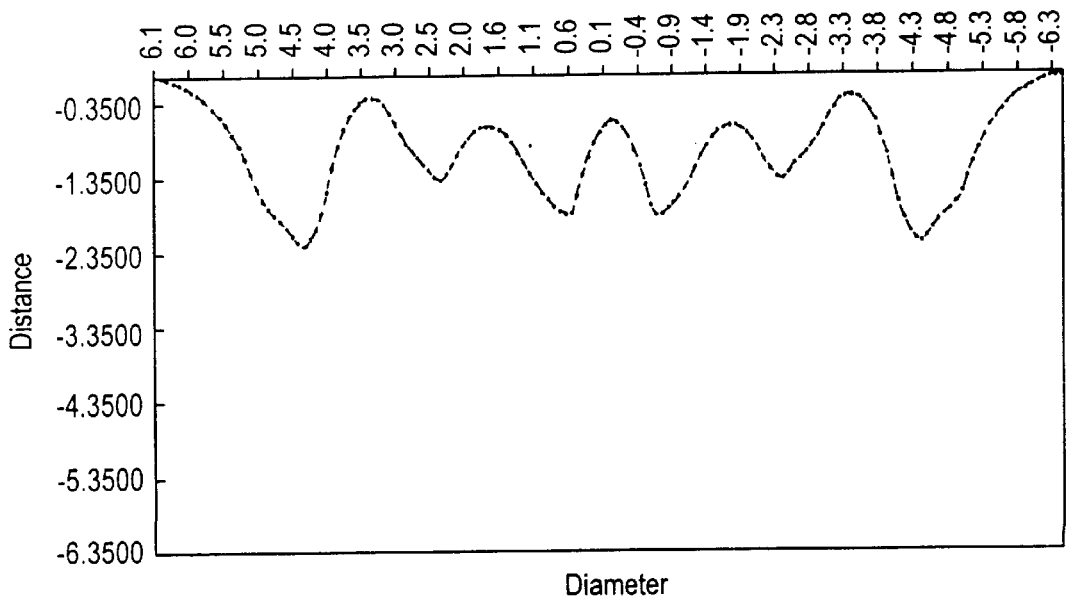
FIG. 3B is a graph illustrating an erosion profile of a titanium nitride target surface after repeated deposition processes utilizing a conventional magnetron assembly.
Figure 4:
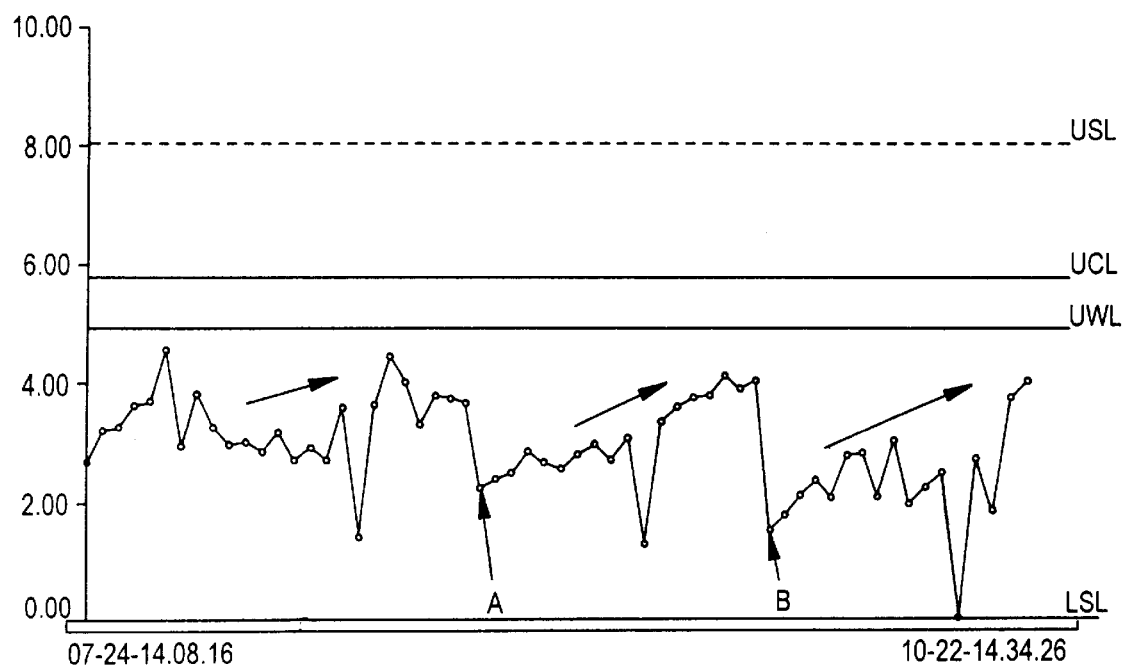
FIG. 4 is a graph illustrating the non-uniformity of the deposited film by using a conventional magnetron assembly.

As shown in FIG. 6, the traversing means 70 is constructed of a platform 72 which has a threaded aperture 74 therein for engaging a worm gear 76. On top of the platform 72, a magnet 80 is securely mounted to a top surface 78 of the platform. The platform 72 and the worm gear 76 may be engaged to a motor 90 which only engages and drives platform 72. Alternatively, motor 90 may further be utilized to drive a second worm gear 86 which in turn drives a second platform 82 and a second magnet 84.

When the dual-platform arrangement of FIG. 6 is used, a single motor means 90 can be advantageously used to drive both platforms 72, 82 and both magnets 80, 84 in traversing motions toward and away from the center axis 56. Depending on the total number of magnets utilized, a plurality of traversing means 80 may be mounted on the top surface 52 of the present invention magnetron assembly 50. A single motor means (not shown) may even be used to drive all six magnets 60 of FIG. 5 by suitably arranging the worm gears to engage the single motor means. As shown in FIG. 6, the rotational motion of the worm gears 76, 86 transforms into a linear traversing motion of the magnets 80, 84 when the worm gears are driven by motor 90. It has been found that a suitable traversing speed of the magnets 80, 84 is between about 2 mm/sec and about 20 mm/sec. By "about", it is meant that the value may be ±10% of the value given. For instance, when an 8 inch wafer, or a 200 mm diameter wafer, is sputter deposited for approximately 20 seconds, two complete traversing motions made during the 20 seconds time period is sufficient to practice the present invention novel method. It may be preferred that the platforms 72, 82 be guided by recessed track sections in the surface 54 of the flat disc 52 such that the traversing motion of the platforms is always guided at the exact location without deviation. For simplicity reasons, the track sections are not shown in FIG. 5.

The present invention novel method and apparatus have therefore been amply described in the above descriptions and in the appended drawings of FIGS. 5 and 6.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows:

1. A magnetron assembly for sputter deposition comprising:

a disc for rotating about a central axis and for mounting a plurality of magnets thereon, and a plurality of magnets mounted spaced-apart circumferentially on said disc, each of said plurality of magnets being mounted on a traversing means for moving in a radial direction toward and away from the central axis simultaneously with said rotating motion of said disc such that a substantially uniform magnetic field is generated.

2. A magnetron assembly for sputter deposition according to claim 1, wherein said traversing means further comprises:

a platform on which a magnet is mounted, a threaded aperture in said platform, a worm gear for threadingly engaging said threaded aperture, and a motor means for rotating said worm gear to cause a linear traversing motion of said platform toward and away from said center axis.

3. A magnetron assembly for sputter deposition according to claim 1 further comprising six magnets and three traversing means with two magnets mounted on each traversing means.

4. A magnetron assembly for sputter deposition according to claim 1, wherein said traversing means moves at a linear speed between about 2 mm/sec and about 20 mm/sec.

5. A magnetron assembly for sputter deposition according to claim 1, wherein said disc comprises a ring-shaped disc.

6. A magnetron assembly for sputter deposition according to claim 1, wherein said plurality of magnets are mounted equally spaced-apart circumferentially on said disc.

7. A magnetron assembly for sputter deposition according to claim 1 further comprising a metal target having substantially the same size as the disc mounted juxtaposed to said disc.

8. A method for sputter depositing a metal on an electronic substrate comprising the steps of:

providing a magnetron assembly comprising a disc for rotating about a center axis and a plurality of magnets mounted thereon, each of said plurality of magnets being mounted on a traversing means for moving radially toward and away from said center axis simultaneously with the rotating motion of said disc, mounting a metal target on said disc of the magnetron assembly, positioning said magnetron assembly in a sputter chamber with said metal target over said electronic substrate, activating said magnetron assembly and igniting a plasma in said chamber, and sputter depositing metal from said metal target onto said electronic substrate.

9. A method for sputter depositing a metal on an electronic substrate according to claim 8 further comprising the step of evacuating said sputter chamber prior to activating said magnetron assembly.

10. A method for sputter depositing a metal on an electronic substrate according to claim 8 further comprising the step of operating said traversing means by first mounting said plurality of magnets on a platform and then traversing said platform by motor and worm gear means.

11. A method for sputter depositing a metal on an electronic substrate according to claim 8 further comprising the step of operating said traversing means at a speed between about 2 mm/sec and about 20 mm/sec.

12. A method for sputter depositing a metal on an electronic substrate according to claim 8 further comprising the step of mounting six magnets equally spaced circumferentially on said disc on three traversing means such that each one of said three traversing means operates two magnets in a synchronized manner.

13. A method for sputter depositing a metal on an electronic substrate according to claim 10 further comprising the step of transforming a rotational motion of said worm gear means into a linear motion of said platform.

14. A method for sputter depositing a metal on an electronic substrate according to claim 10 further comprising the step of threadingly engaging said worm gear means with a threaded aperture in said platform.

15. A method for sputter depositing a metal on an electronic substrate according to claim 8 further comprising the step of generating a substantially uniform magnetic flux distribution in said magnetron assembly by traversing said magnets simultaneously with the rotational motion of said disc.

16. A sputter deposition chamber comprising:

a magnetron assembly situated on top of said chamber comprising a disc for rotating about a center axis and for mounting a plurality of magnets thereon wherein each of said plurality of magnets traverses toward and away from said center axis simultaneously with the rotational motion of said disc, a metal target having a size substantially similar to said disc mounted on said disc, a plasma generating means for producing a plasma in said chamber, a wafer holder for supporting a wafer juxtaposed to said metal target, and a vacuum evacuation means for evacuating said deposition chamber.

17. A sputter deposition chamber according to claim 16 further comprising traversing means for mounting said plurality of magnets.

18. A sputter deposition chamber according to claim 16, wherein said traversing means further comprises:

a platform on which a magnet is mounted, a threaded aperture in said platform, a worm gear for threadingly engaging said threaded aperture, and a motor means for rotating said worm gear to cause a linear traversing motion of said platform toward and away from said center axis.

19. A sputter deposition chamber according to claim 16, wherein said magnetron assembly further comprises six magnets and three traversing means with two magnets mounted on each traversing means.

20. A sputter deposition chamber according to claim 17, wherein said traversing means moves at a linear speed between about 2 mm./sec and about 20 mm/sec.

* * * * *